United States Patent
Park et al.

(10) Patent No.: US 7,049,235 B2
(45) Date of Patent: *May 23, 2006

(54) METHOD OF MANUFACTURING SEMICONDUCTOR DEVICE

(75) Inventors: Seong Hwan Park, Chungcheongbuk-do (KR); Chang Hwan Lee, Daegu (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 6 days.

This patent is subject to a terminal disclaimer.

(21) Appl. No.: 10/723,485

(22) Filed: Nov. 26, 2003

(65) Prior Publication Data

US 2004/0202967 A1    Oct. 14, 2004

(30) Foreign Application Priority Data

Apr. 8, 2003    (KR) .............. 10-2003-0022007

(51) Int. Cl.
*H01L 21/461*    (2006.01)

(52) U.S. Cl. ............... 438/689; 438/745; 438/746; 430/331

(58) Field of Classification Search .......... 438/689, 438/745, 746; 430/331
See application file for complete search history.

(56) References Cited

U.S. PATENT DOCUMENTS 6,029,679 A    2/2000    Ota et al.
6,043,005 A    3/2000    Haq
2004/0202969 A1*    10/2004    Park et al. .......... 430/331

FOREIGN PATENT DOCUMENTS

| EP | 0939344 A1 | 9/1999 |
| EP | 0788143 B1 | 9/2000 |
| WO | WO-97/36209 | 10/1997 |

OTHER PUBLICATIONS

Fujimura et al., "Ashing of the Ion Implanted Resist Layer," Digest of Papers 1989 2nd MicroProcess Conference, Jul. 2-5, 1989.

Search Report from German Patent and Trademark Office Dated Nov. 17, 2004.

* cited by examiner

*Primary Examiner*—Thanh Nguyen
(74) *Attorney, Agent, or Firm*—Marshall, Gerstein & Borun LLP

(57) ABSTRACT

A method of manufacturing a semiconductor device includes a process for forming a photoresist pattern. In the disclosed process, residual photoresist polymers are removed using a photoresist polymer remover composition that includes: (a) 5% to 15% of sulfuric acid based on the total weight of said composition, (b) 1% to 5% of hydrogen peroxide or 0.0001% to 0.05% of ozone based on the total weight of said composition, (c) 0.1% to 5% of acetic acid based on the total weight of said composition, (d) 0.0001% to 0.5% of ammonium fluoride based on the total weight of said composition and (e) remaining amount of water.

16 Claims, 3 Drawing Sheets

METHOD OF MANUFACTURING SEMICONDUCTOR DEVICE

TECHNICAL FIELD

Methods of manufacturing semiconductor devices using a photoresist polymer remover composition are disclosed. The photoresist polymer remover composition effectively removes photoresist residuals generated from etching or ashing sub-processes in photoresist pattern forming processes during the manufacturing of semiconductor devices.

DESCRIPTION OF THE RELATED ART

In a conventional semiconductor device manufacturing process, a photoresist pattern is formed on a conductive layer which has been formed on a semiconductor substrate. The conductive layer whose portion is not covered by the pattern is etched using the photoresist pattern as a mask to form a conductive layer pattern. This lithography process is then repeated to form the conductive patterns The photoresist pattern is used as the mask and it should be removed from the conductive layer with a photoresist remover in a strip process after the process for forming the conductive layer pattern is completed. However, it is difficult to remove photoresist material in the subsequent strip process since the etching process for forming a conductive layer pattern is performed with a dry etching process when making highly integrated devices and, as a result, the physical property of photoresist is deteriorated during the dry etching process.

Dry etching processes have replaced wet etching processes which use liquid acid compositions. In dry etching, gas-solid phase reaction are generated between a plasma etching gas and a conductive layer. Since sharp patterns are obtained with dry etching processes and they are easy to control, dry etching processes are preferred to wet etching processes.

However, during dry etching process, ions and radicals included in the plasma etching gas cause a complicated chemical reaction on the surface of a photoresist film which rapidly hardens the photoresist material. In addition, a "puffing" phenomenon occurs, thereby generating a residue of the photoresist material. As a result, it is difficult to remove the photoresist material.

Specifically, when the dry etching process is performed on metal conductive layers such as aluminum films, aluminum alloy films and titanium nitride films, photoresist polymers on sidewalls of the metal conductive layer are chemically transformed and hardened. As a result, the photoresist polymers are not easily removed even by various removers in a strip process.

The currently available remover compositions including organic amine compounds and various organic solvents that are also used in the wet etching process. The available remover compositions typically include mono-ethanolamine.

However, in current semiconductor device manufacturing processes, the above remover does not fully remove the photoresist material primarily because the photoresist material has been baked at high temperatures because various substrates such as silicon wafers are treated at a high temperature ranging from 110 to 140° C. The remover compositions containing water, hydroxyl amines or mixtures thereof have been developed for removing photoresist materials baked at high temperatures.

Since the photoresist materials are exposed to plasma gas in dry etching or ashing processes which are used for manufacturing ultra high integrated circuits, the remover compositions do not fully remove photoresist polymers which are chemically transformed and hardened. As a result, development of photoresist removers to overcome the above-described problem is needed.

A semiconductor substrate treated with the ashing process is conventionally heated at a high temperature of over 200° C. Here, residual solvent in the photoresist material should be vaporized and exhausted. However, a hardened layer which remains on the photoresist surface after the ashing process prevents exhaustion of the residual solvents. As a result, the surface of the photoresist film can be broken or cracked by the residual solvent as internal pressure of the photoresist film increases during the ashing process, which is called a "puffing" phenomenon.

Since the hardened layer shattered by the puffing phenomenon still remains on the photoresist material, it is difficult to remove the photoresist material with common removers. Such photoresist material is transformed into residues and particles, which may become polluters and causes to lower yield rate in manufacture of ultra high integrated circuits. When the ashing process is performed before the strip process to remove the photoresist material, the transformation of the photoresist layer is deteriorated, which results in defects during the strip process.

Of various ashing processes to effectively remove the above-described transformed and hardened photoresist material, the two-step ashing process wherein the common ashing process is performed and then the second ashing process is re-performed is proposed (Fujimura, Digest of Papers 1989 $2^{nd}$ MicroProcess Conference, Japan, pp. 196–197, 1989). However, since these processes are complicated and comprise large-scale equipment, their production yield is degraded.

Only strip processes using compositions for removing photoresist polymers have been used. Of the compositions, recently proposed photoresist removers comprising hydroxyl amine, alkanol amine, corrosion inhibitor and water are extensively used because they are more effective to remove relatively transformed and hardened photoresist material. However, the above compositions do not fully remove photoresist polymers on metal lines or sidewalls of interlayer insulating films in production line of semiconductors such as DRAMs of 256M or more where new metal films are used for metal lines or new insulating materials used for interlayer insulating films. As a result, a photoresist remover to complement the above-described problem is also needed.

SUMMARY OF THE DISCLOSURE

Accordingly, improved photoresist polymer remover compositions are disclosed, which effectively remove photoresist polymers formed on sidewalls and bottoms of lower films of the photoresist by dry etching or ashing processes in processes for forming metal lines, via hole patterns and other patterns. When the lower films are metal films, the disclosed photoresist polymer remover compositions minimize corrosion of the metal films.

DETAILED DESCRIPTION OF THE PRESENTLY PREFERRED EMBODIMENTS

Figure 1:
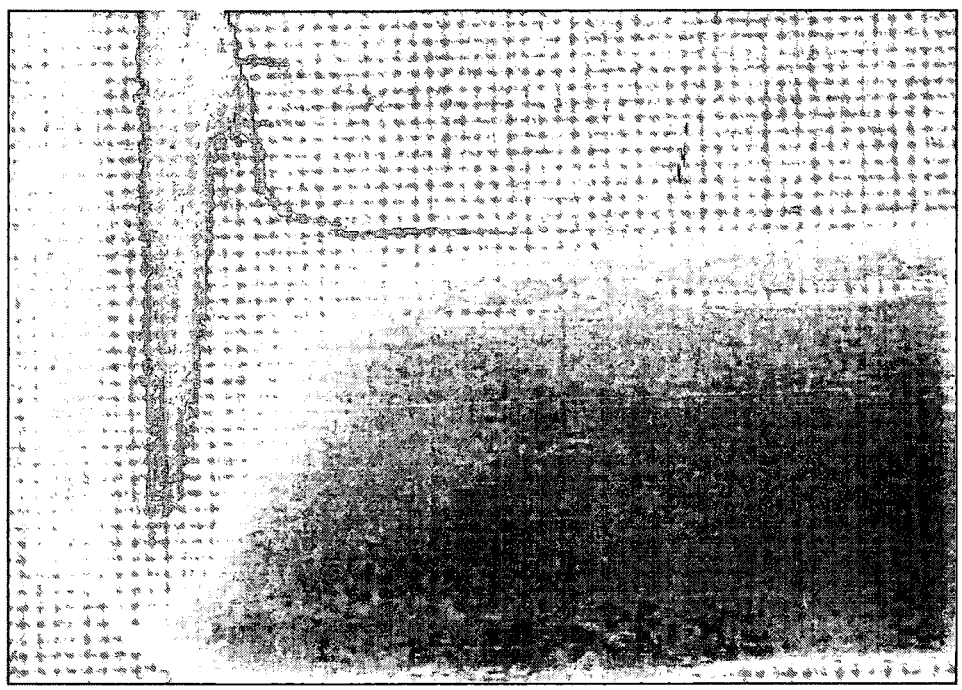
FIG. 1 is a SEM (Scanning Electron Microscope) photograph showing a photoresist pattern treated with a dry etching process or an ashing process.

A disclosed photoresist polymer remover composition comprising (a) sulfuric acid, (b) hydrogen peroxide or ozone, (c) acetic acid, (d) ammonium fluoride and (e) water.

One photoresist polymer remover composition comprises (a) 5% to 15% of sulfiric acid based on the total weight of said composition, (b) 1% to 5% of hydrogen peroxide or 0.0001% to 0.05% of ozone based on the total weight of said composition, (c) 0.1% to 5% of acetic acid based on the total weight of said composition, (d) 0.0001% to 0.5% of ammonium fluoride based on the total weight of said composition and (e) remaining amount of water.

The sulfuric acid is preferably present in an amount ranging from 5 to 15 wt %, more preferably, from 7 to 10 wt %. Photoresist polymer detergency may be degraded when the sulfuric acid is present in an amount of less than 5 wt % while metal films may be corroded when the sulfuric acid is present in an amount of more than 15 wt %.

The hydrogen peroxide is preferably present in an amount ranging from 1 to 5 wt %, more preferably, from 2 to 4 wt %. Photoresist polymer detergency is degraded when the hydrogen peroxide is present in an amount of less than 1 wt % while economic efficiency is degraded when the hydrogen peroxide present in an amount of more than 5 wt %. When ozone which is a strong oxidizer is used, photoresist residues may be effectively removed by the ozone of small concentration. The ozone is preferably present in an amount ranging from 0.0001 to 0.05 wt %, more preferably, from 0.0002 to 0.001 wt %. The photoresist polymer detergency of the disclosed solutions may be degraded when the ozone is present in an amount of less than 0.0001 wt % while economic efficiency may be degraded when the ozone is present in an mount of more than 0.05 wt %. The hydrogen peroxide and the ozone may be selectively used.

The acetic acid is preferably present in an amount ranging from 0.1 to 5 wt %, more preferably, from 0.5 to 2 wt %. Photoresist polymer detergency may be degraded when the acetic acid is present in an amount of less than 0.1 wt % while corrosion of metal films may be deepened when the acetic acid is present in an amount of more than 5 wt %.

The ammonium fluoride is preferably present in an amount ranging from 0.0001 to 0.5 wt %, more preferably, from 0.01 to 0.05 wt %. When the ammonium fluoride is present in an amount of less than 0.0001 wt %, it is difficult to completely remove transformed photoresist polymers on sidewalls and bottoms of lower films by dry etching and ashing processes in a pattern formation process. When the ammonium fluoride is present in an amount of more than 0.5 wt %, HSQ (Hydrogen Silsesquioxane) films such as FOX (Flowable Oxide) films of stacked films in via hole patterns are corroded.

The disclosed photoresist polymer remover composition also includes water, which is preferably pure water filtered through ion exchange resin, and more preferably ultra pure water having resistivity of 18 MΩ.

There is also provided a method of manufacturing a semiconductor device where photoresist polymer residuals are removed using the disclosed remover composition.

The above method comprises the steps of:
(a) preparing a semiconductor substrate on which an underlying layer is formed;
(b) forming a photoresist pattern on the underlying layer;
(c) selectively etching the underlying layer using the photoresist pattern as an etching mask; and
(d) cleaning the resulting structure with the disclosed remover composition to remove residual photoresist polymers, whereby forming the underlying layer pattern.

In the above process, the underlying layer is a metal film or an insulating film. Here, the metal film is preferably selected from the group consisting of aluminum film, aluminum alloy film, titanium film, titanium nitride film, tungsten film, and combinations thereof. In case of stacked films, a stacked film comprising titanium nitride film/aluminum film/titanium film from the lower to the upper portion is preferable. When the underlying layer is an insulating film, the insulating film preferably is a HSQ film. In generally, a metal film is formed under the insulating film.

Any conventional photoresist polymers may be used for polymers included in the above photoresist.

The etching process in the step (c) is a dry etching process, and may further comprise an ashing process to first remove a photoresist pattern after the dry etching process and before the step (d).

The photoresist pattern is formed by a photolithography process. Here, an exposure light source may be ArF (193 nm), KrF (248 nm), $F_2$ (157 nm), EUV (13 nm), E-beam, X-ray or ion-beam. After and before exposure, a bake process is performed.

The underlying layer pattern may be an insulating film hole pattern or a metal line/space pattern.

Instead of the photoresist pattern formation process using a mask, a dry etching process such as an etch-back process or CMP (Chemical Mechanical Polishing) process is performed to clean the exposed photoresist film using the disclosed remover composition.

The cleaning process of the step (d) may be performed using single-type or batch-type equipment. Although the cleaning condition may be differentiated by states of the photoresist material to be removed, the photoresist material is soaked using chemicals at room temperature or below 60° C. for about 10 to 60 seconds to completely remove photoresist polymers.

The disclosed photoresist polymer remover composition may easily remove photoresist polymers formed on sidewalls and bottoms of the lower films of photoresist by dry etching or ashing processes in recent high-integrated circuit semiconductor device manufacturing process for manufacturing semiconductor device within a short time. When the lower film is an aluminium film, aluminum alloy film or tungsten film, the photoresist polymer remover composition may effectively remove photoresist polymers formed on sidewalls of the lower metal film.

The disclosed remover composition effectively removes photoresist polymers and minimizes corrosion of new lower metal films applied to yield line of ultra high integrated circuits such as DRAMs of over 256M. Also, the disclosed remover composition prevents an attack phenomenon on HSQ films such as FOX films of stacked films in the via hole pattern formation process.

The disclosed photoresist polymer remover compositions will be described in more details by referring to examples below, which are not intended to be limiting.

EXAMPLES 1–5 AND COMPARATIVE EXAMPLES 1–3

Preparation of Photoresist Polymer Remover Composition

Each ingredient was mixed in ratios shown in the following table 1 to obtain photoresist polymer remover compositions of Examples 1–5 and Comparative Examples 1–3.

TABLE 1

| | | (a) Sulfuric acid | (b) Hydrogen peroxide | (b) ozone | (c) Acetic acid | (d) Ammonium fluoride | HF | (e) Water |
|---|---|---|---|---|---|---|---|---|
| Example | 1 | 5 | 5 | — | 2 | 0.05 | — | Residue |
| | 2 | 10 | 3 | — | 2 | 0.05 | — | Residue |
| | 3 | 10 | 5 | — | 0.5 | 0.05 | — | Residue |
| | 4 | 10 | 5 | — | 2 | 0.025 | — | Residue |
| | 5 | 10 | — | 0.0005 | 2 | 0.05 | — | Residue |
| Comparative Example | 1 | 10 | 5 | — | 3 | — | 0.05 | Residue |
| | 2 | 10 | 5 | — | 3 | — | — | Residue |
| | 3 | 10 | 5 | — | — | 0.05 | — | Residue |

Performance evaluation on the remover compositions of the Examples and Comparative Examples was performed by the following methods of Experimental Examples.

EXPERIMENTAL EXAMPLE 1

Removal of Polymer (1) Preparation of Test sample A

On an 8-inch silicon wafer where a titanium nitride film, an aluminum film and a titanium film were sequentially deposited from the lower to the upper portion at 100 Å, 8000 Å and 400 Å, respectively, a conventional positive-type resist composition sold under the designation "DPR-i1000" by Dongjin Semichem Co. Ltd. was spin-coated to obtain a resist film of 1.01 μm. Thereafter, the resist film was pre-baked on a hot plate at 110° C. for 90 seconds. A mask having a predetermined pattern was located on the resist film, and irradiated with ultraviolet rays. Then, the exposed resist film was developed at 21° C. for 60 seconds by TMAH developing solution of 2.38 wt % to form a photoresist pattern. A test sample where the photoresist pattern was formed was hard-baked at 120° C. for 100 seconds on the hot plate. The titanium nitride film, the aluminum film and the titanium film were etched using the photoresist pattern as a mask and $Cl_2/BCl_3$ mixed gas as etching gas in dry etching equipment (Applied Multireal Co., Model: DPS+) for EPD (End Point Detection)+45 seconds. Then, the ashing process was performed to remove most of the photoresist material using $O_2$ plasma, thereby obtaining Test sample A. FIG. 1 shows the cross-section of the Test sample A. Photoresist polymers still exist on sidewalls of the Test sample A.

(2) Removal of Photoresist Polymer

The Test sample A was soaked in each photoresist polymer remover of Examples 1–5 and Comparative Examples 1–3 at room temperature. The Test sample A was washed with ultra pure water, and dehydrated with nitrogen gas. Then, whether photoresist polymer residuals were attached on sidewalls of the pattern and on the surface of the line pattern was examined by the Scanning Electron Microscope (SEM, Hitachi Co. Ltd., Model: S-5000) in order to evaluate polymer removal performance. The experimental results were shown in the following table 2, and FIGS. 2 and 3.

TABLE 2

| | | Soaking Time | | |
|---|---|---|---|---|
| | | 15 sec. | 30 sec. | 60 sec. |
| Example | 1 | ○ | ○ | ○ |
| | 2 | ○ | ○ | ○ |
| | 3 | ○ | ○ | ○ |
| | 4 | ○ | ○ | ○ |
| | 5 | ○ | ○ | ○ |
| Comparative Example | 1 | ○ | ○ | ○ |
| | 2 | X | X | X |
| | 3 | X | X | Δ |

○: photoresist residuals were completely removed on sidewalls and the surface of the line pattern
Δ: more than 80% of photoresist residuals were removed on sidewalls and the surface of the line pattern
X: most of photoresist residuals were not removed on sidewalls and the surface of the line pattern Referring to Table 2, the polymer removal performance of Examples 1–5 and Comparative Example 1 was far superior to that of Comparative Examples 2 and 3.

Figure 2:
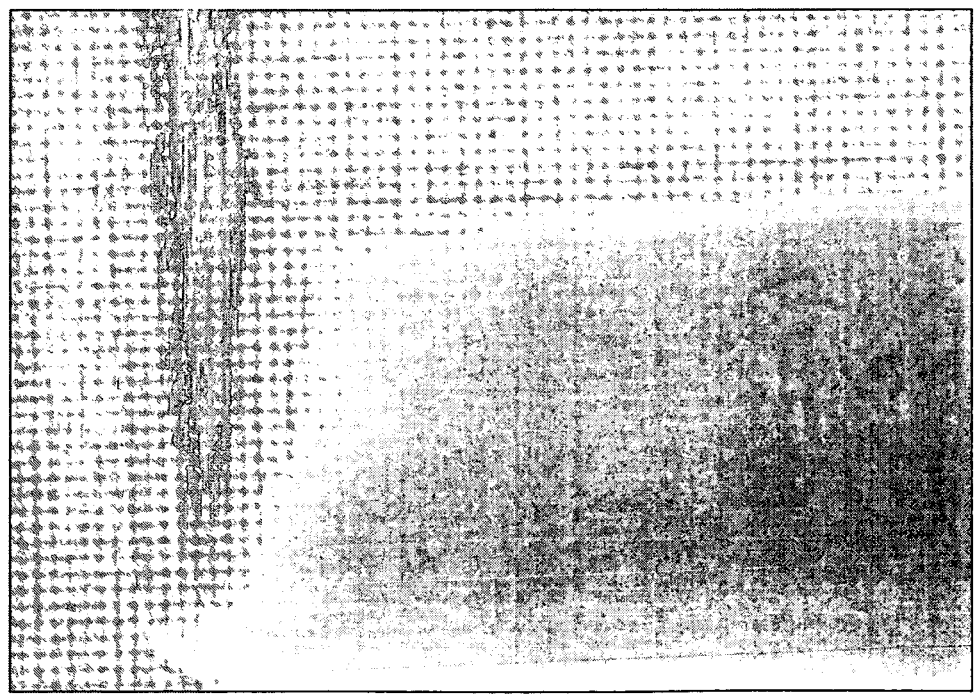
FIG. 2 is a SEM photograph showing experimental results when photoresist polymers are removed at room temperature using a photoresist polymer remover composition of Example 1 in accordance with this disclosure.
Figure 3:
FIG. 3 is a SEM photograph showing experimental results when photoresist polymers are removed at room temperature using a photoresist polymer remover composition of Comparative Example 2.

FIGS. 2 and 3 are SEM photographs showing experimental results when photoresist polymers are removed using the photoresist polymer remover compositions of Example 1 and Comparative Example 2, respectively. The photoresist polymers were completely removed using the remover composition of Example 1 (see FIG. 2) while the photoresist polymers were not completely removed using the remover composition of Comparative Example 2 (see FIG. 3).

EXPERIMENTAL EXAMPLE 2

Corrosion of Metal Film (1) Preparation of Test sample B

The procedure of Example 1 was repeated to obtain Test sample B.

(2) Experiment of Metal Film Corrosion

The Test sample B was soaked in each photoresist polymer remover composition of Examples 1–5 and Comparative Examples 1–3 at room temperature. The Test sample B was washed with ultra pure water and dehydrated with nitrogen gas. Then, whether an undercut phenomenon occurred in the lower metal film was examined by SEM to show corrosion degree of the lower metal film.

TABLE 3

|  |  | Soaking Time | | |
|---|---|---|---|---|
|  |  | 1 min. | 3 min. | 5 min. |
| Example | 1 | ○ | ○ | ○ |
|  | 2 | ○ | ○ | ○ |
|  | 3 | ○ | ○ | ○ |
|  | 4 | ○ | ○ | ○ |
|  | 5 | ○ | ○ | ○ |
| Comparative Example | 1 | X | X | X |
|  | 2 | ○ | ○ | ○ |
|  | 3 | ○ | ○ | ○ |

○: when the undercut phenomenon did not occur in the lower metal film
Δ: when the undercut phenomenon partially occurred in the lower metal film
X: when the undercut phenomenon severely occurred in the lower metal film As shown in Table 3, the undercut phenomenon did not occur in the lower metal film after 5 minutes of the soaking time in Examples 1–5. However, in Comparative Example 1, the undercut phenomenon severely occurred in the lower metal film even the Test sample B was soaked for 1 minute. Although the experimental results of metal film corrosion were positive in Comparative Examples 2 and 3, most photoresist polymer residuals were not removed on sidewalls and the surface of the line pattern as shown in Table 2. Accordingly, the remover composition of Comparative Examples 2 and 3 are not useful.

Figure 4:
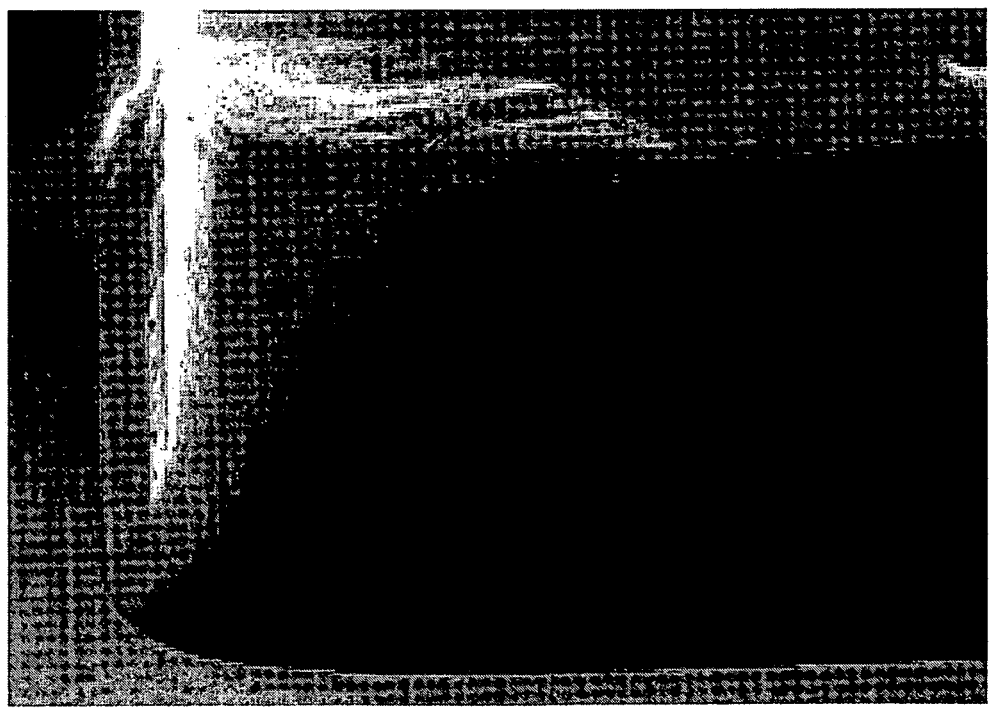
FIG. 4 is a SEM photograph showing experimental results of metal film corrosion at room temperature using the photoresist polymer remover composition of Example 1 in accordance with this disclosure.
Figure 5:
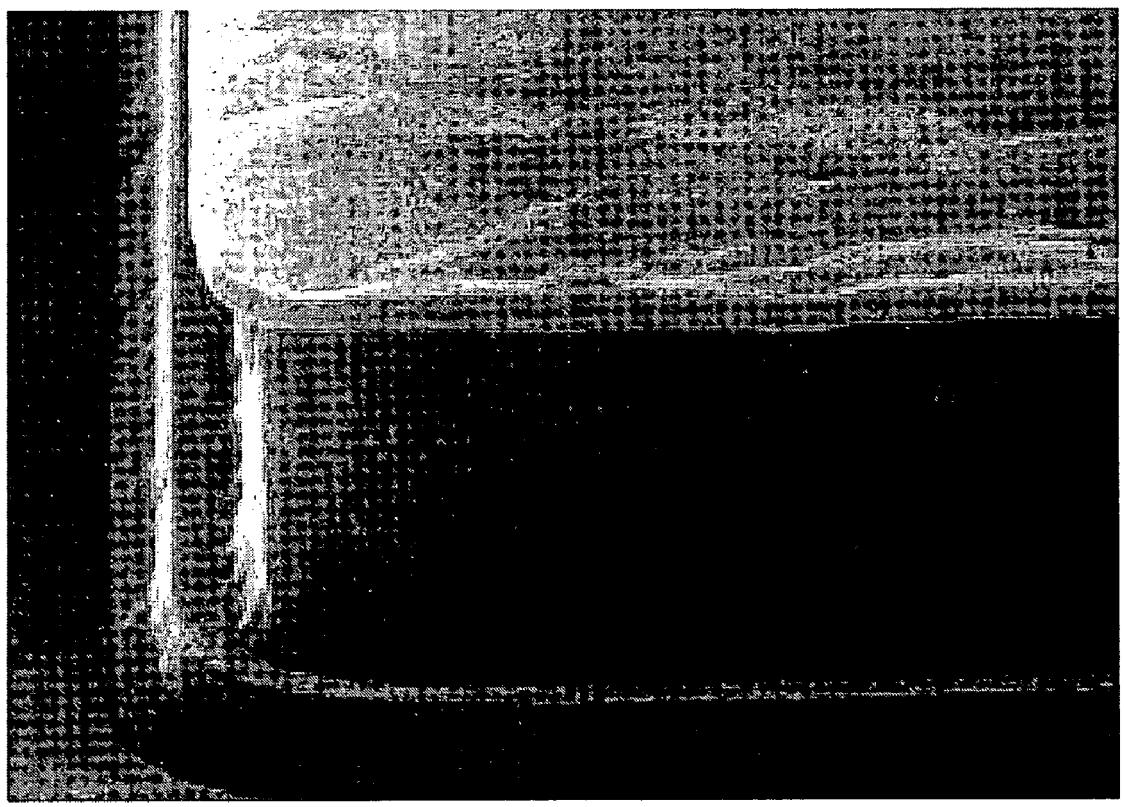
FIG. 5 is a SEM photograph showing experimental results of metal film corrosion at room temperature using a photoresist polymer remover composition of Comparative Example 1.

FIGS. 4 and 5 are SEM photographs showing experimental results of metal film corrosion at room temperature using a photoresist polymer remover composition of Example 1 and Comparative Example 1, respectively. The undercut phenomenon did not occur in the lower metal film when the remover composition of Example 1 was used (see FIG. 4). However, the undercut phenomenon severely occurred in the lower metal film when the remover composition of Comparative Example 1 was used (see FIG. 5).

EXPERIMENTAL EXAMPLE 3

Application to Production Line

The evaluation results of a disclosed remover composition applied to semiconductor device production line are shown in the following tables 4 (hole pattern forming process) and 5 (line pattern forming process).

TABLE 4

| Device/Process | Evaluation Item | Evaluation Result |
|---|---|---|
| 64MSD G/Process1 Post-Cleaning | Polymer removability | Completely removed |
|  | Sidewall film (HSQ) attack | None |
|  | Titanium nitride film attack | None |
|  | Foreign substance test on run (KLA foreign substance test) | No specific foreign substance, No plug missing |
|  | PT1(Probe Test)/PCM(Process Control Monitoring Test) | No significant difference compared to the conventional remover |
|  | WFBM(Wafer Fail Bit Map) → M2C related fail | No related fail |
|  | PKG Test | No significant difference compared to the conventional remover |
| 256M DDR(BC)/Process1 Post-cleaning | Polymer removability | Completely removed |
|  | Sidewall film (HSQ) attack | None |
|  | Titanium nitride film attack | None |
|  | Foreign substance test on run (KLA foreign substance) | No specific foreign substance |
|  | PT1(Probe Test)/PCM (Process Control Monitoring Test) | No significant difference compared to the conventional remover |

The detailed process represented in Table 4 is as follows.

(64MSD G/Process 1 Post-cleaning)

(1) A titanium film and a titanium nitride film were formed on a semiconductor substrate at 200 Å and 800 Å, respectively. (2) A tungsten (W) film was formed on the resulting structure at 4000 Å. (3) The tungsten film was dry-etched by an etch-back process in dry-etching equipment using $SF_6$ gas. (4) A titanium film, an aluminum-copper film and a titanium nitride film were formed on the resulting structure at 100 Å, 8000 Å and 400 Å, respectively. (5) A photoresist pattern was formed on the resulting structure. (6) The metal line was dry-etched using the photoresist pattern as a mask in dry-etching equipment using $BCl_3/Cl_2$ gas, and consecutively the photoresist film was removed using $O_2/CF_4/H_2O$ gas. (7) The wafer was treated with the disclosed remover composition at 30° C. for 30 seconds while the wafer was rotated with single type wet cleaning equipment at 400 RPM (revolutions per minute). Then, the resulting wafer was washed with ultra pure water for 60 seconds, and dehydrated using a spin dry at 2900 RPM for 30 seconds. The experimental results were shown in Table 4.

(256M DDR(BC)/Process1 Post-cleaning)

(1) A titanium film and a titanium nitride film were formed on a semiconductor substrate at 200 Å and 100 Å, respectively. (2) A tungsten (W) film was formed on the resulting structure at 4000 Å. (3) A titanium film, an aluminum-copper film, a titanium film and a titanium nitride film were formed on the resulting structure at 100 Å, 4000 Å, 100 Å and 750 Å, respectively. (4) A photoresist pattern was formed on the resulting structure. (5) The metal line was dry-etched using the photoresist pattern as a mask in dry-etching equipment using $BCl_3/Cl_2$ gas, and consecutively the photoresist film was removed using $O_2/CF_4/H_2O$ gas. (6) The wafer was treated with the disclosed remover composition at 30° C. for 30 seconds while the wafer was rotated with single type wet cleaning equipment at 400 RPM. Then, the resulting wafer was washed with ultra pure water for 60 seconds, and dehydrated using a spin dry at 2900 RPM for 30 seconds. The experimental results were shown in Table 4.

(128M DDR(BC)/Process3 Post-cleaning)

(1) A titanium film and a titanium nitride film were formed on a semiconductor substrate at 200 Å and 100 Å, respectively. (2) A tungsten (W) film was formed on the resulting structure at 4000 Å. (3) A titanium film, an aluminum-copper film, a titanium film and a titanium nitride film were formed on the resulting structure at 100 Å, 4000 Å, 100 Å and 750 Å, respectively. (4) A photoresist pattern was formed on the resulting structure. (6) The metal line was dry-etched using the photoresist pattern as a mask in dry-etching equipment using $BCl_3/Cl_2$ gas, and consecutively the photoresist film was removed using $O_2/CF_4/H_2O$ gas. (6) The wafer was treated with the disclosed remover composition at 30° C. for 30 seconds while the wafer was rotated with single type wet cleaning equipment at 400 RPM. Then, the resulting wafer was washed with ultra pure water for 60 seconds, and dehydrated using a spin dry at 2900 RPM for 30 seconds. The experimental results were shown in Table 5.

Referring to Tables 4 and 5, when the disclosed remover composition is applied to the actual production line, photoresist polymers are shown to be completely removed using the disclosed remover composition. Additionally, the prob-

TABLE 5

| Device/Process | Evaluation Item | Evaluation Result |
| --- | --- | --- |
| 256M DDR(BC)/ Process2 Post-cleaning | Corrosion | No corrosion |
| | Polymer removability | Completely removed |
| | Sidewall film (metal such as Al) attack and undercut | None |
| | Lower IMD(Inter Metal Dielectric) film attack | None |
| 128M DDR(BC)/ Process3 Post-cleaning | Corrosion | No corrosion |
| | Polymer removability | Completely removed |
| | Sidewall film (metal such as Al) attack and undercut | None |
| | Lower IMD (Inter Metal Dielectric) film attack | None |
| | Foreign substance test on run (KLA foreign substance test) | No specific foreign substance |
| | PT1(Probe Test)/PCM(Process Control Monitoring Test) | No significant difference compared to the conventional remover |

The detailed process represented in Table 5 is as follows.

(256M DDR(BC)/Process2 Post-cleaning)

(1) A titanium film and a titanium nitride film were formed on a semiconductor substrate at 200 Å and 800 Å, respectively. (2) A tungsten (W) film was formed on the resulting structure at 4000 Å. (3) The tungsten film was dry-etched by an etch-back process in dry-etching equipment using $SF_6$ gas. (4) A titanium film, an aluminum-copper film and a titanium nitride film were formed on the resulting structure at 100 Å, 8000 Å and 400 Å, respectively. (5) A photoresist pattern was formed on the resulting structure. (6) The metal line was dry-etched using the photoresist pattern as a mask in dry-etching equipment using $BCl_3/Cl_2$ gas, and consecutively the photoresist film was removed using $O_2/CF_4/H_2O$ gas. (7) The wafer was treated with the disclosed remover composition at 30° C. for 30 seconds while the wafer was rotated with single type wet cleaning equipment at 400 RPM. Then, the resulting wafer was washed with ultra pure water for 60 seconds, and dehydrated using a spin dry at 2900 RPM for 30 seconds. The experimental results were shown in Table 5.

lems such as corrosion, sidewall attack and undercut which are caused the residual polymers after cleaning are not shown.

As discussed earlier, the disclosed photoresist polymer remover compositions may easily remove photoresist polymers formed on sidewalls and bottoms of the lower films of the photoresist by dry etching or ashing processes in processes for forming metal lines, via hole patterns and other patterns within a short time. When the lower films are metal films, the photoresist polymer remover compositions may minimize corrosion of the metal films.

What is claimed is:

1. A method of manufacturing a semiconductor device comprising a process of forming a photoresist pattern using a photoresist polymer remover composition, said composition comprising:

(a) 5% to 15% of sulfuric acid based on the total weight of said composition;

(b) 1% to 5% of hydrogen peroxide or 0.0001% to 0.05% of ozone based on the total weight of said composition;

(c) 0.1% to 5% of acetic acid based on the total weight of said composition;

(d) 0.0001% to 0.5% of ammonium fluoride based on the total weight of said composition; and (e) remaining amount of water.

2. The method according to claim 1, said composition comprising:
   (a) 7% to 10% of sulfuric acid based on the total weight of said composition;
   (b) 2% to 4% of hydrogen peroxide or 0.0002% to 0.001% of ozone based on the total weight of said composition;
   (c) 0.5% to 2% of acetic acid based on the total weight of said composition;
   (d) 0.01% to 0.05% of ammonium fluoride based on the total weight of said composition; and
   (e) remaining amount of water.

3. The method according to claim 1, wherein the composition is further characterized as a dry etching cleaner.

4. The method according to claim 1, wherein the process of forming a photoresist pattern comprises the steps of:
   preparing a semiconductor substrate on which an underlying layer is formed;
   forming a photoresist pattern on the underlying layer;
   selectively etching the underlying layer using the photoresist pattern as an etching mask; and
   cleaning the resulting structure using the photoresist polymer remover composition to remove residual photoresist polymers, whereby forming the underlying layer pattern.

5. The method according to claim 4, wherein the underlying layer is selected from the group consisting of aluminum film, aluminum alloy film, titanium film, titanium nitride film, tungsten film, and combinations thereof.

6. The method according to claim 5, wherein the underlying layer is a stacked film where a titanium nitride film, an aluminum film and a titanium film are sequentially deposited.

7. The method according to claim 4, wherein the underlying layer is an insulating film, and a metal film is formed under the insulating film.

8. The method according to claim 7, wherein the underlying layer is a HSQ (Hydrogen Silsesquioxane) film.

9. The method according to claim 4, further comprising the step of removing the photoresist pattern by an ashing process after the etching and before the cleaning.

10. The method according to claim 4, wherein the photoresist pattern is formed by a photolithography process using ArF (193 nm), KrF (248 nm), $F_2$ (157 nm), EUV (13 nm), E-beam, X-ray or ion-beam as an exposure light source.

11. The method according to claim 4, wherein said underlying layer pattern is an insulating film hole pattern or metal line/space pattern.

12. The method according to claim 4, wherein the photoresist pattern is formed by an etch-back process or CMP (Chemical Mechanical Polishing) process.

13. The method according to claim 4, wherein the cleaning is performed using single-type or batch type equipment.

14. A semiconductor device manufactured by the method of claim 4.

15. A method of cleaning a photoresist pattern using a composition comprising:
   (a) 5% to 15% of sulfuric acid based on the total weight of said composition;
   (b) 1% to 5% of hydrogen peroxide or 0.0001% to 0.05% of ozone based on the total weight of said composition;
   (c) 0.1% to 5% of acetic acid based on the total weight of said composition;
   (d) 0.0001% to 0.5% of ammonium fluoride based on the total weight of said composition; and
   (e) remaining amount of water.

16. A photolithographic method comprising the steps of:
   forming a photoresist pattern on a semiconductor substrate; and
   cleaning the photoresist pattern using a photoresist polymer remover composition, said composition comprising:
   (a) 5% to 15% of sulfuric acid based on the total weight of said composition;
   (b) 1% to 5% of hydrogen peroxide or 0.0001% to 0.05% of ozone based on the total weight of said composition;
   (c) 0.1% to 5% of acetic acid based on the total weight of said composition;
   (d) 0.0001% to 0.5% of ammonium fluoride based on the total weight of said composition; and
   (e) remaining amount of water.

* * * * *